(12) United States Patent
Nishioka et al.

(10) Patent No.: US 8,446,927 B2
(45) Date of Patent: May 21, 2013

(54) SEMICONDUCTOR LASER DEVICE AND MANUFACTURING METHOD THEREOF

(75) Inventors: Yoshito Nishioka, Kyoto (JP); Yoichi Mugino, Kyoto (JP); Tsuguki Noma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/359,492

(22) Filed: Jan. 26, 2012

(65) Prior Publication Data

US 2012/0195338 A1    Aug. 2, 2012

(30) Foreign Application Priority Data

Jan. 27, 2011    (JP) ................... 2011-015731
Jan. 27, 2011    (JP) ................... 2011-015732

(51) Int. Cl.
*H01S 5/00* (2006.01)

(52) U.S. Cl.
USPC .................. 372/45.011; 372/45.01

(58) Field of Classification Search
USPC .......................... 372/45.011, 45.01
See application file for complete search history.

(56) References Cited

U.S. PATENT DOCUMENTS

| | | |
|---|---|---|
| 5,048,035 A | 9/1991 | Sugawara et al. |
| 5,737,351 A | 4/1998 | Ono |
| 5,933,442 A | 8/1999 | Sawano et al. |
| 5,946,336 A | 8/1999 | Mizutani et al. |
| 2005/0041710 A1 | 2/2005 | Makita et al. |
| 2010/0103970 A1 * | 4/2010 | Shigihara .................. 372/45.01 |

FOREIGN PATENT DOCUMENTS

| | | |
|---|---|---|
| JP | 5-29702 | 2/1993 |
| JP | 5-218582 | 8/1993 |
| JP | 5-259571 | 10/1993 |
| JP | 6-21578 | 1/1994 |
| JP | 07-111367 A | 4/1995 |
| JP | 9-232678 | 9/1997 |
| JP | 2000-183437 | 6/2000 |
| JP | 2001-77465 | 3/2001 |
| JP | 2003-37331 | 2/2003 |
| JP | 2003-78208 | 3/2003 |

(Continued)

OTHER PUBLICATIONS

Tanaka et al.: "Highly efficient TE/TM mode switching of GaAsP/AlGaAs strained quantum-well laser diodes," American Institute of Physics, Appl. Phys. Lett., vol. 64, No. 2, Jan. 10, 1994, pp. 158-160.

*Primary Examiner* — Kinam Park
(74) *Attorney, Agent, or Firm* — Rabin & Berdo, P.C.

(57) ABSTRACT

A semiconductor laser device includes a p-type clad layer and an n-type clad layer, a p-side guide layer and an n-side guide layer interposed between the p-type clad layer and the n-type clad layer, and an active layer interposed between the p-side guide layer and the n-side guide layer. The active layer includes at least two quantum well layers and a barrier layer interposed between the quantum well layers adjoining to each other. Each of the p-type clad layer and the n-type clad layer is formed of a $(Al_{x1}Ga_{(1-x1)})_{0.51}In_{0.49}P$ layer ($0 \leq x1 \leq 1$). Each of the p-side guide layer, the n-side guide layer and the barrier layer is formed of a $Al_{x2}Ga_{(1-x2)}As$ layer ($0 \leq x2 \leq 1$). Each of the quantum well layers is formed of a $GaAs_{(1-x3)}P_{x3}$ layer ($0 \leq x3 \leq 1$). The $(Al_{x1}Ga_{(1-x1)})_{0.51}In_{0.49}P$ layer has a composition satisfying an inequality, $x1 > 0.7$. The $Al_{x2}Ga_{(1-x2)}As$ layer has a composition satisfying an inequality, $0.4 \leq x2 \leq 0.8$.

20 Claims, 20 Drawing Sheets

FOREIGN PATENT DOCUMENTS

| | | |
|---|---|---|
| JP | 2004-88054 | 3/2004 |
| JP | 2004-339544 | 12/2004 |
| JP | 2005-285875 | 10/2005 |
| JP | 2006-222445 | 8/2006 |
| JP | 2009-302582 | 12/2009 |
| JP | 2010-80757 | 4/2010 |
| JP | 2010-98091 | 4/2010 |

* cited by examiner

SEMICONDUCTOR LASER DEVICE AND MANUFACTURING METHOD THEREOF

CROSS-REFERENCE TO RELATED APPLICATIONS

This application claims the benefit of and priority from Japan Patent Application Nos. 2011-15731 and 2011-15732, filed on Jan. 27, 2011, respectively, the entire contents of which are incorporated herein by reference.

TECHNICAL FIELD

The present disclosure(s) relate to a semiconductor laser device and a manufacturing method thereof.

BACKGROUND

In order to increase a storage capacity of a hard disc drive (HDD), there is a need to record signals in a microscale region of a disc. For the purpose of writing signals in the microscale region of a disc while assuring the stability of the recorded signals in the presence of thermal changes, it is necessary to use a thermally stable recording medium. This however poses a dilemma in that strong magnetic fields are required to rewrite the signals. Nowadays, the recording density grows saturated in an up-to-date GMR (Giant Magneto Resistance) method. Thus, there is a need for a "heat-assisted recording" method.

SUMMARY

The present disclosure(s) include some embodiments of a semiconductor laser device capable of obtaining TM-mode oscillation. Moreover, the present disclosure(s) include some embodiments of a semiconductor laser device which is suitable for large output purposes and capable of obtaining stable TM-mode oscillation.

The "heat-assisted recording" method refers to a method in which, using a laser diode (semiconductor laser device) as a heat source, a force for holding magnetic fields is temporarily weakened and a writing task is performed in that state. Unlike a conventional semiconductor laser device for optical pickup, a semiconductor laser device used in a recording device of "heat-assisted recording" types need to generate a large output despite its small chip size. Since a restriction is imposed on the mounting space of the semiconductor laser device, it is sometimes necessary to realize not only TE (Transverse Electric) polarization, but also TM (Transverse Magnetic) polarization.

According to some embodiments, there is provided a semiconductor laser device. The semiconductor laser device includes a p-type clad layer and an n-type clad layer, a p-side guide layer and an n-side guide layer, and an active layer. The p-side guide layer and the n-side guide layer are interposed between the p-type clad layer and the n-type clad layer. The active layer is interposed between the p-side guide layer and the n-side guide layer. The active layer includes at least two quantum well layers and a barrier layer interposed between the quantum well layers adjoining to each other. Each of the p-type clad layer and the n-type clad layer is formed of a $(Al_{x1}Ga_{(1-x1)})_{0.51}In_{0.49}P$ layer ($0 \leq x1 \leq 1$). Each of the p-side guide layer, the n-side guide layer and the barrier layer is formed of an $Al_2Ga_{(1-x2)}As$ layer ($0 \leq x2 \leq 1$). Each of the quantum well layers is formed of a $GaAs_{(1-x3)}P_{x3}$ layer ($0 \leq x3 \leq 1$). The $(Al_{x1}Ga_{(1-x1)})_{0.51}In_{0.49}P$ layer has a composition, where $x1>0.7$, and the $Al_2Ga_{(1-x2)}As$ layer having a composition, where $0.4 \leq x2 \leq 0.8$.

In the configuration of some embodiments, each of the p-type clad layer and the n-type clad layer is formed of a $(Al_{x1}Ga_{(1-x1)})_{0.51}In_{0.49}P$ layer ($0 \leq x1 \leq 1$) while each of the p-side guide layer and the n-side guide layer is formed of a $Al_2Ga_{(1-x2)}As$ layer ($0 \leq x2 \leq 1$). It is therefore possible to increase the band gap difference between the clad layers and the guide layers. Since the clad layers and the guide layers are formed of materials differing in self-diffusing coefficient from each other, it is possible to make different the diffusing velocity of carriers in the clad layers and the diffusing velocity of carriers in the guide layers. This makes it possible to prevent the carriers from being excessively implanted into the active layer. As a consequence, it is possible to restrain or prevent occurrence of a so-called carrier overflow phenomenon in which the carriers overflow from the active layer to the clad layers or other surrounding layers in proportion to the rise in temperature. Accordingly, it is possible to restrain or prevent deterioration of characteristics which may be caused by the carrier overflow phenomenon.

In the configuration of some embodiments, the $(Al_{x1}Ga_{(1-x1)})_{0.51}In_{0.49}P$ layer has a composition, where $x1>0.7$, and the $Al_2Ga_{(1-x2)}As$ layer has a composition, where $0.4 \leq x2 \leq 0.8$. The reasons are as follows. The band gaps of the clad layers and the guide layers become greater as the Al composition grows higher. As set forth above, the band gap difference between the guide layers and the clad layers may be set equal to or greater than a predetermined value to prevent the carriers from being excessively implanted into the active layer. More specifically, the band gap of the clad layers may be increased, while the band gap of the guide layers is decreased. The band gap difference can be made equal to or greater than the predetermined value by setting x1 greater than 0.7 and setting x2 equal to or smaller than 0.8.

In the semiconductor laser device, a tensile strain may have a lattice mismatch rate of not greater than −0.4% and not less than −0.9% be generated in each of the quantum well layers. If the lattice mismatch rate is greater than −0.4% (if the tensile strain is too small), the oscillation in the TM mode is hard to occur. If the lattice mismatch rate is smaller than −0.9% (if the tensile strain is too large), crystal defects are generated with ease.

In the semiconductor laser device, the oscillation wavelength may be not less than 780 nm and not greater than 830 nm and that the thickness of each of the quantum well layers be not less than 9 nm and not greater than 12 nm. If the oscillation wavelength and the thickness of the quantum well layers satisfy the above-noted conditions, it is possible to keep a TM component light output greater than a TE component light output and to reduce a threshold current.

In the semiconductor laser device, the $GaAs_{(1-x3)}P_{x3}$ layer may have a composition satisfying a condition that a ratio $x3/(1-x3)$ of a composition x3 of P to a composition (1-x3) of As is not less than 1/9 and not greater than 1/4. The reasons are as follows. In order to cause the semiconductor laser device to oscillate in the TM mode, it is necessary that a tensile strain is generated in each of the quantum well layers. If the lattice constant of the quantum well layers grows smaller, it is possible to generate a greater tensile strain in each of the quantum well layers. The lattice constant of the $GaAs_{(1-x3)}P_{x3}$ layer forming the quantum well layers grows smaller as the ratio $x3/(1-x3)$ of the composition of P to the composition of As becomes greater. In other words, if the ratio $x3/(1-x3)$ becomes larger, it is possible to generate a greater tensile strain in each of the quantum well layers.

The reason for the ratio x3/(1−x3) may be not less than 1/9 is to make the TM component light output greater than the TE component light output. On the other hand, the reason for the ratio x3/(1−x3) may be not greater than 1/4 is that, if the ratio x3/(1−x3) is greater than 1/4, the tensile strain generated in each of the quantum well layers due to the increase of the P composition becomes greater, which may possibly generate a crack and a leak current.

According to some embodiments, each of the quantum well layers has a thickness of not less than 9 nm and not greater than 12 nm, the barrier layer having a thickness smaller than the thickness of each of the quantum well layers. In the semiconductor laser device, the number of the quantum well layers may be not less than 2 and not greater than 5. If the number of the quantum well layers is less than 2, there is a need to increase the thickness of one of the quantum well layers. Thus, crystal defects are generated with ease. On the other hand, if the number of the quantum well layers is greater than 5, there exist an increased number of interfaces. Thus, crystal defects are generated with ease. In the semiconductor laser device, the p-type clad layer and the n-type clad layer may have a carrier concentration of not less than $0.7 \times 10^{18}$ cm$^{-3}$ and not greater than $2.0 \times 10^{18}$ cm$^{-3}$. If the carrier concentration is less than $0.7 \times 10^{18}$ cm$^{-3}$, it becomes difficult to implant the carriers into the active layer. On the other hand, if the dopant concentration is greater than $2.0 \times 10^{18}$ cm$^{-3}$, the carriers are excessively implanted into the active layer. The excess carriers become a light absorbing source, thereby worsening the oscillation efficiency.

In the semiconductor laser device, the end surface window structures for expanding a band gap of the active layer may be formed in end surface portions of a laser resonator. If the end surface window structures are formed in the end surface portions of the laser resonator, it is possible to expand the band gap of the active layer in the end surface portions. Thus, the inductively emitted light generated by the recombination of electrons and positive holes within the active layer is hard to be absorbed in the end surface portions of the laser resonator, which makes it possible to restrain generation of heat. It is therefore possible to reduce the end-surface optical damage and to acquire a large output.

In the semiconductor laser device, the end surface window structures may be formed by selectively diffusing impurities into the end surface portions of the laser resonator and that a diffusion length of the impurities from an interface between the n-side guide layer and the n-type clad layer toward the n-type clad layer is not less than 400 nm and not greater than 1300 nm. In some embodiments, when the diffusion length is less than 400 nm, it sometimes becomes difficult to obtain the effect provided by the end surface window structures. In other alternate embodiments, if the diffusion length is greater than 1300 nm, the diffusion amount of impurities sometimes becomes larger, which may possibly result in deterioration of the characteristics.

The semiconductor laser device, in some embodiments, includes: an n-type clad layer; a first p-type clad layer; a ridge stripe including a second p-type clad layer formed into a ridge stripe shape on the opposite surface of the first p-type clad layer from the n-type clad layer; an active layer interposed between the n-type clad layer and the first p-type clad layer such that a tensile strain is generated in the active layer; and a current-confining layer formed on the side surfaces of the ridge stripe. The ridge stripe is formed such that a first ridge width as the width of a surface of the second p-type clad layer existing at the same side as the first p-type clad layer is not less than 3.0 μm and not greater than 4.5 μm and a second ridge width as the width of a surface of the second p-type clad layer existing at the opposite side from the first p-type clad layer is not less than 2.0 μm. With this configuration, there is provided the active layer in which a tensile strain is generated. It is therefore possible to obtain a semiconductor laser device oscillating in the TM mode.

If the first ridge width is too small, carriers tend to concentrate on the width-wise central region of the semiconductor laser device during operation and the current density grows higher. Therefore, a kink is generated with ease. On the other hand, if the first ridge width is too large, a current diffusing range becomes greater and a carrier supply shortage occurs during operation. Therefore, a kink is generated with ease. Since the first ridge width is set not less than 3.0 μm and not greater than 4.5 μm, in some embodiments, it is possible to restrain or prevent generation of the kink. Accordingly, it is possible to obtain a semiconductor laser device with stable characteristics.

If the second ridge width is too small, the resistance of the ridge stripe becomes greater. The increase in the resistance of the ridge stripe leads to an increase in an operating current and a decrease in a peak value of the light output. Since the second ridge width is set not less than 2.0 μm, in some embodiments, it is possible to reduce the resistance of the ridge stripe. This makes it possible to lower the operating current and to prevent the decrease in the peak value of the light output.

In the semiconductor laser device, the first p-type clad layer may have a thickness of not less than 300 nm and not greater than 400 nm. If the thickness of the first p-type clad layer is smaller than 300 nm, it is difficult to reduce the refractive index difference between the first p-type clad layer and the active layer. Thus, a kink is generated with ease. On the other hand, if the thickness of the first p-type clad layer is greater than 400 nm, the current flow path extending from the second p-type clad layer to the active layer becomes longer, thereby deteriorating the characteristics.

In some embodiments, the semiconductor laser device is a three-time-grown semiconductor laser device manufactured by forming a p-type contact layer after the current-blocking layer is formed. The current-blocking layer is formed of an n-type $(Al_{x4}Ga_{(1-x4)})_{0.51}In_{0.49}P$ ($0 \leq x4 \leq 1$) layer that has a composition, where $0.7 \leq x4 \leq 0.9$.

If the Al composition in the n-type $(Al_{x4}Ga_{(1-x4)})_{0.51}In_{0.49}P$ layer forming the current-blocking layer becomes greater, the refractive index of the current-blocking layer grows smaller. If x4 is smaller than 0.7, the refractive index difference between the first and second p-type clad layers and the current-blocking layer becomes smaller. This weakens the light confinement effect in the width direction provided by the current-blocking layer. Thus, the operating current grows larger and the peak output becomes smaller. On the other hand, if x4 is greater than 0.9, the refractive index difference between the first and second p-type clad layers and the current-blocking layer becomes too great. This makes too strong the light confinement effect in the width direction provided by the current-blocking layer. Thus, the light density is increased and the kink is generated with ease. In the embodiment set forth above, the $(Al_{x4}Ga_{(1-x4)})_{0.51}In_{0.49}P$ layer has a composition, where $0.7 \leq x4 \leq 0.9$. It is therefore possible to prevent reduction of the peak output and to restrain or prevent generation of the kink. This makes it possible to obtain a semiconductor laser device which is suitable for large output purposes and stable in characteristics.

In the semiconductor laser device, the n-type $(Al_{x4}Ga_{(1-x4)})_{0.51}In_{0.49}P$ current-blocking layer may have a thickness of not less than 300 nm and not greater than 450 nm. If the thickness of the current-blocking layer is less than 300 nm, it is likely that, when seen in a cross section view, the light beam emits toward the contact layer beyond the current-blocking layer. On the other hand, if the thickness of the current-blocking layer is greater than 450 nm, it becomes difficult to form the current-blocking layer.

According to some embodiments, the semiconductor laser device is a one-time-grown semiconductor laser manufactured by forming a p-type contact layer, when forming the second p-type clad layer, and then forming the current-blocking layer. The current-blocking layer is formed of a $SiO_2$ layer or a SiN layer. In the semiconductor laser device, the current-blocking layer may have a thickness of not less than 200 nm and not greater than 300 nm. If the thickness of the current-blocking layer is less than 200 nm, it is likely that, when seen in a cross section view, the light beam emits from the current-blocking layer. On the other hand, if the thickness of the current-blocking layer is greater than 300 nm, a stress is generated in the active layer due to the difference in thermal expansion coefficient between the current-blocking layer and the active layer. This is because the $SiO_2$ or SiN layer is hard. Consequently, it is likely that the magnitude of the tensile strain generated in the active layer may undergo a change.

In the semiconductor laser device, the end surface window structures for expanding a band gap of the active layer may be formed in end surface portions of a laser resonator. If the end surface window structures are formed in the end surface portions of the laser resonator, it is possible to expand the band gap of the active layer in the end surface portions. Thus, the inductively emitted light generated by the recombination of electrons and positive holes within the active layer is hard to be absorbed in the end surface portions of the laser resonator, which makes it possible to restrain generation of heat. It is therefore possible to reduce the end-surface optical damage and to acquire a large output of the device.

In the semiconductor laser device, the n-type clad layer, the first p-type clad layer and the second p-type clad layer may be formed of a $(Al_{x1}Ga_{(1-x1)})_{0.51}In_{0.49}P$ layer that has a composition, where x1>0.7. The reasons are as follows. The band gaps of the n-type clad layer, the first p-type clad layer and the second p-type clad layer become greater as the Al composition grows higher. The band gap difference between the guide layers and the clad layers be set equal to or greater than a predetermined value in order for the clad layers to satisfactorily perform carrier confinement and light confinement. The band gap difference can be made equal to or greater than the predetermined value by setting x1 greater than 0.7.

According to some embodiments, there is provided a method of manufacturing a semiconductor laser device. The method forming a p-type clad layer and an n-type clad layer; forming a p-side guide layer and an n-side guide layer interposed between the p-type clad layer and the n-type clad layer; and interposing an active layer between the p-side guide layer and the n-side guide layer, the active layer including at least two quantum well layers and a barrier layer interposed between the quantum well layers adjoining to each other, each of the p-type clad layer and the n-type clad layer being formed of a $(Al_{x1}Ga_{(1-x1)})_{0.51}In_{0.49}P$ layer ($0 \leq x1 \leq 1$), each of the p-side guide layer, the n-side guide layer and the barrier layer being formed of a $Al_{x2}Ga_{(1-x2)}As$ layer ($0 \leq x2 \leq 1$), each of the quantum well layers being formed of a $GaAs_{(1-x3)}P_{x3}$ layer ($0 \leq x3 \leq 1$).

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Figure 1:
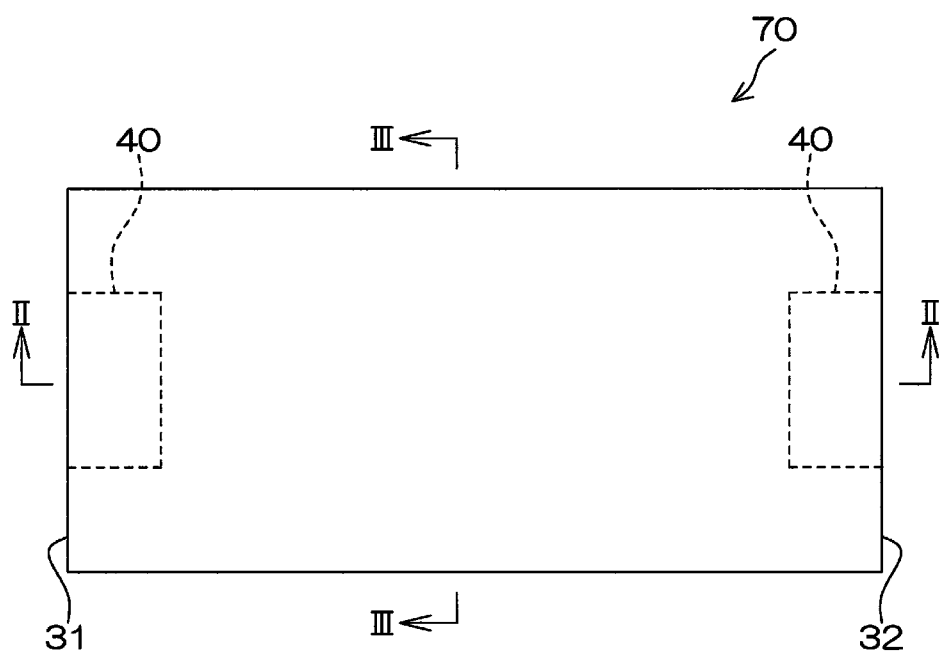
FIG. 1 is a plan view for illustrating a semiconductor laser diode configuration, according to some embodiments.
Figure 2:
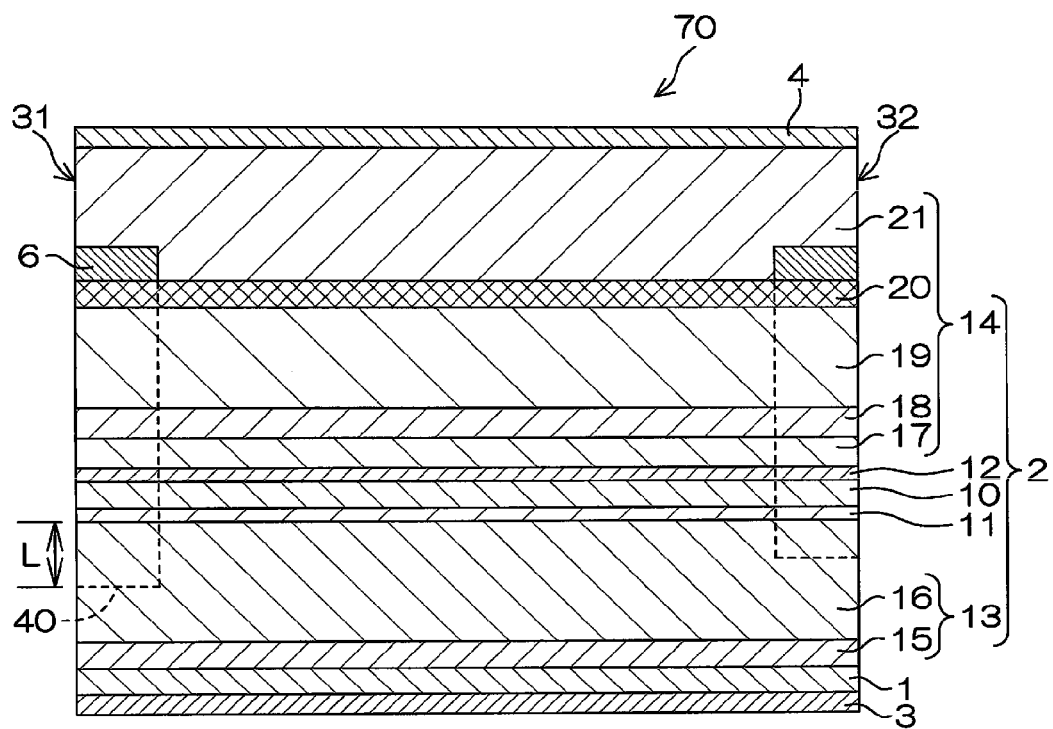
FIG. 2 is a section view taken along line II-II in FIG. 1.
Figure 3:
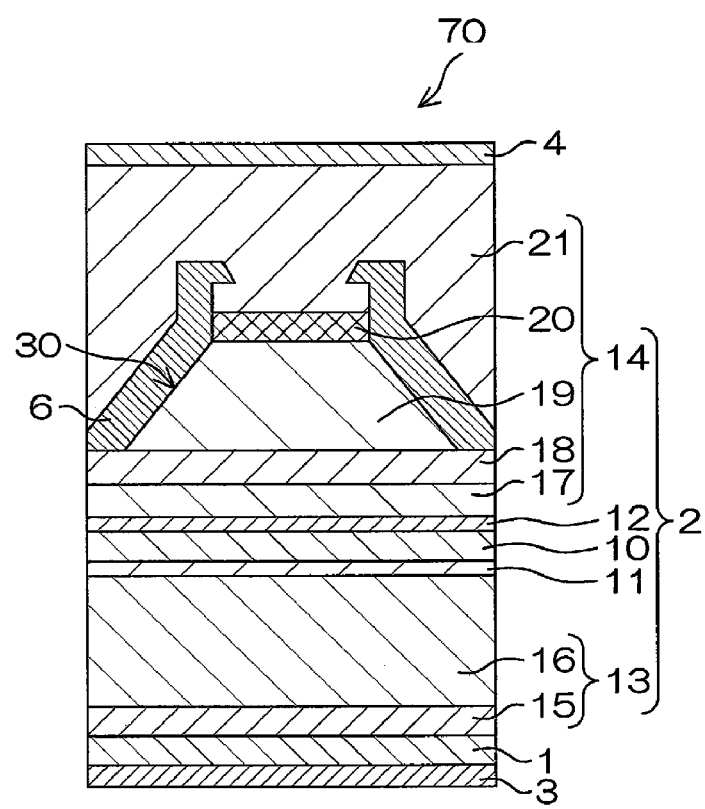
FIG. 3 is a section view taken along line III-III in FIG. 1.

Various embodiments will now be described in detail with reference to the accompanying drawings. FIG. 1 is a plan view for illustrating a configuration of a semiconductor laser diode according to some embodiments. FIG. 2 is a section view taken along line II-II in FIG. 1. FIG. 3 is a section view taken along line III-III in FIG. 1. The semiconductor laser diode 70 is a three-time-grown semiconductor laser diode manufactured through a three-time crystal growing step. The semiconductor laser diode 70 is also a Fabry-Perot type semiconductor laser diode including, as shown in FIGS. 2 and 3, a substrate 1, a semiconductor laminate structure 2 formed on the substrate 1 by crystal growth, an n-type electrode 3 formed in contact with the rear surface of the substrate 1 (the opposite surface of the substrate 1 from the semiconductor laminate structure 2) and a p-type electrode 4 formed in contact with the front surface of the semiconductor laminate structure 2.

The substrate 1 may be formed of a GaAs monocrystalline substrate, but other types of substrates are possible. The plane direction of the front surface of the GaAs substrate 1 has an off-angle of 10 degrees with respect to a (100) plane. Individual layers that make up the semiconductor laminate structure 2 are caused to epitaxially grow with respect to the substrate 1. The term "epitaxial growth" used herein refers to crystal growth performed while keeping the continuity of lattices from a ground layer. The mismatch of the lattices with respect to the ground layer is absorbed by the distortion of lattices of a crystal-grown layer, thereby maintaining the continuity of lattices on the interface with the ground layer.

The semiconductor laminate structure 2 includes an active layer 10, an n-side guide layer 11, a p-side guide layer 12, an n-type semiconductor layer 13 and a p-type semiconductor layer 14. The n-type semiconductor layer 13 is arranged between the n-side guide layer 11 and the top surface of the substrate 1. The n-side guide layer 11 is arranged between the n-type semiconductor layer 13 and the active layer 10.

The p-type semiconductor layer 14 is arranged on the p-side of the active layer 10 at which the p-type electrode 4 exists. The p-side guide layer 12 is arranged between the active layer 10 and the p-type semiconductor layer 14. Thus, there is formed a double hetero-junction. Electrons are implanted into the active layer 10 from the n-type semiconductor layer 13 via the n-side guide layer 11. Positive holes are implanted into the active layer 10 from the p-type semiconductor layer 14 via the p-side guide layer 12. Light is emitted as the electrons and the positive holes are recombined in the active layer 10.

The n-type semiconductor layer 13 is formed by laminating an n-type GaAs buffer layer 15 and an n-type $(Al_{x1}Ga_{(1-x1)})_{0.51}In_{0.49}P$ clad layer $(0 \leq x1 \leq 1)$ 16 from the front side of the substrate 1. The width of the n-type GaAs buffer layer 15 may be one of many possible widths. For example, the thickness of the n-type GaAs buffer layer 15 may be 50 nm to 100 nm or may have a thickness of 100 nm. The n-type $(Al_{x1}Ga_{(1-x1)})_{0.51}In_{0.49}P$ clad layer $(0 \leq x1 \leq 1)$ 16 may also be one of many possible widths, and may, for example, have a thickness of 2000 nm to 3000 nm or a thickness of 2500 nm.

The p-type semiconductor layer 14 may be formed by laminating, on the p-type guide layer 12, a first p-type $(Al_{x1}Ga_{(1-x1)})_{0.51}In_{0.49}P$ clad layer $(0 \leq x1 \leq 1)$ 17, a p-type InGaP etching stop layer 18, a second p-type $(Al_{x1}Ga_{(1-x1)})_{0.51}In_{0.49}P$ clad layer $(0 \leq x1 \leq 1)$ 19, a p-type GaAs cap layer 20 and a p-type GaAs contact layer 21. The first p-type $(Al_{x1}Ga_{(1-x1)})_{0.51}In_{0.49}P$ clad layer $(0 \leq x1 \leq 1)$ 17 may have a thickness of, e.g., 250 nm to 400 nm or a thickness of 300 nm, but other widths may be possible. The p-type InGaP etching stop layer 18 may have a thickness of, e.g., 5 nm to 10 nm, or a thickness of 5 nm, but other widths may be possible. The second p-type $(Al_{x1}Ga_{(1-x1)})_{0.51}In_{0.49}P$ clad layer $(0 \leq x1 \leq 1)$ 19 may have a thickness of, e.g., 1000 nm to 1500 nm, or a thickness of 1000 nm, but other widths are possible.

The p-type GaAs cap layer 20 may have a thickness of, e.g., 50 nm to 100 nm, or a thickness of 100 nm but other widths are possible. The p-type GaAs contact layer 21 may have a thickness of, e.g., 1000 nm to 2000 nm, or a thickness of 1000 nm but other widths are possible.

The n-type GaAs buffer layer 15 is provided to increase the adhesiveness between the GaAs substrate 1 and the n-type $(Al_{x1}Ga_{(1-x1)})_{0.51}In_{0.49}P$ clad layer 16. The n-type GaAs buffer layer 15 may become an n-type semiconductor layer by doping, e.g., utilizing an Si as an n-type dopant, on GaAs. The p-type GaAs contact layer 21 is a low resistance layer for making ohmic contact with the p-type electrode 4. The p-type GaAs contact layer 21 may become a p-type semiconductor layer by doping, e.g., utilizing Zn as a p-type dopant, on GaAs. It will be appreciated, however, that other dopants may be utilized.

The n-type clad layer 16 and the first and second p-type clad layers 17 and 19 provide a carrier confinement effect by which the carriers (electrons and positive holes) are confined in the active layer 10, and a light confinement effect by which the light coming from the active layer 10 is confined between the n-type clad layer 16 and the first and second p-type clad layers 17 and 19. The n-type $(Al_{x1}Ga_{(1-x1)})_{0.51}In_{0.49}P$ clad layer 16 may be converted to an n-type semiconductor layer by doping, e.g., Si as an n-type dopant, on $(Al_{x1}Ga_{(1-x1)})_{0.51}In_{0.49}P$. The first and second p-type $(Al_{x1}Ga_{(1-x1)})_{0.51}In_{0.49}P$ clad layers 17 and 19 are converted to p-type semiconductor layers by doping, e.g., Zn as a p-type dopant, on $(Al_{x1}Ga_{(1-x1)})_{0.51}In_{0.49}P$.

The clad layers 16, 17 and 19 may have a dopant concentration of not less than $0.7 \times 10^{18}$ cm$^{-3}$ and not greater than $2.0 \times 10^{18}$ cm$^{-3}$. In some embodiments, if the dopant concentration is lower than $0.7 \times 10^{18}$ cm$^{-3}$, it sometimes becomes difficult to implant the carriers into the active layer 10. In other alternate embodiments, if the dopant concentration is higher than $2.0 \times 10^{18}$ cm$^{-3}$, the carriers are sometimes excessively implanted into the active layer 10. The excess carriers become a light absorbing source, thereby worsening the oscillation efficiency.

In some embodiments, The n-type $(Al_xGa_{(1-x1)})_{0.51}In_{0.49}P$ clad layer 16 is wider in band gap than the n-side guide layer 11. The first and second p-type $(Al_{x1}Ga_{(1-x1)})_{0.51}In_{0.49}P$ clad layers 17 and 19 are wider in band gap than the p-side guide layer 12. This makes it possible to perform the carrier confinement and the light confinement in an efficient manner and to realize a highly efficient semiconductor laser diode.

In some embodiments, reducing the end-surface optical damage allows for a large output to be acquired. In light of this, as set forth below, end surface window structures 40 for expanding the band gap of the active layer 10 may be formed by diffusing impurities such as zinc, or the like, into the laser resonator end surface portions. When diffusing impurities such as zinc, or the like, to form the end surface window structures 40, the diffusing velocity becomes faster if phosphorus is contained in the region to which impurities are to be diffused. In some embodiments, each of the n-type clad layer 16 and the first and second p-type clad layers 17 and 19 is formed of a $(Al_{x1}Ga_{(1-x2)})_{0.51}In_{0.49}P$ layer containing phosphorus. Accordingly, it becomes easy to diffuse impurities such as zinc, or the like, which in turn makes it easy to form the end surface window structures 40. This makes it possible to realize a semiconductor laser diode which is suitable for a large output.

The n-type clad layer 16 and the first and second p-type clad layers 17 and 19 are lattice-matched with the GaAs substrate 1 because the composition ratio of Indium to $(Al_{x1}Ga_{(1-x1)})$ is set equal to 0.51:0.49. It is therefore possible to obtain high-quality crystals. As a result, it is possible to obtain a highly reliable semiconductor laser device. The n-side guide layer 11 is formed of a $Al_2Ga_{(1-x2)}As$ ($0 \leq x2 \leq 1$) layer (having a thickness of, for example, 20 nm to 30 nm or a thickness of 20 nm) and is laminated on the n-type semiconductor layer 13. The p-side guide layer 12 is formed of a $Al_2Ga_{(1-x2)}As$ ($0 \leq x2 \leq 1$) layer (having a thickness of, for example, 20 nm to 30 nm or a thickness of 20 nm) and is laminated on the active layer 10.

The n-side $Al_2Ga_{(1-x2)}As$ guide layer 11 and the p-side $Al_{x2}Ga_{(1-x2)}As$ guide layer 12 are semiconductor layers that cause a light confinement effect to occur in the active layer 10. Additionally, in cooperation with the clad layers 16, 17 and 19, the n-side $Al_{x2}Ga_{(1-x2)}As$ guide layer 11 and the p-side $Al_2Ga_{(1-x2)}As$ guide layer 12 form a carrier confinement structure for blocking carriers within the active layer 10. This makes it possible to increase the efficiency of recombination of electrons and positive holes in the active layer 10.

In some embodiments, the clad layers 16, 17 and 19 are formed of $(Al_{x1}Ga_{(1-x1)})_{0.51}In_{0.49}P$ ($0 \leq x1 \leq 1$) while the guide layers 11 and 12 are formed of $Al_{x2}Ga_{(1-x2)}As$ ($0 \leq x2 \leq 1$). It is therefore possible to increase the band gap difference between the clad layers 16, 17 and 19 and the guide layers 11 and 12. It will be appreciated that other compositions may be utilized to achieve a comparable effect. Since the lattice constants of the clad layers 16, 17 and 19 and that of the guide layers 11 and 12 differ from each other, it is possible to differentiate the diffusing velocity of carriers in the clad layers 16, 17 and 19 and the diffusing velocity of carriers in the guide layers 11 and 12. This makes it possible to prevent the carriers from being excessively implanted into the active layer 10. As a consequence, it is possible to restrain or prevent occurrence of a so-called carrier overflow phenomenon in which the carriers overflow from the active layer 10 to the clad layers 16, 17 and 19 in proportion to the rise in temperature. Accordingly, it is possible to restrain or prevent deterioration of characteristics which may be caused by the carrier overflow phenomenon.

The $(Al_{x1}Ga_{(1-x1)})_{0.51}In_{0.49}P$ layer forming each of the clad layers 16, 17 and 19 may have a composition, where, x1>0.7. The $Al_2Ga_{(1-x2)}As$ layer forming each of the guide layers 11 and 12 may also have a composition, where $0.4 \leq x2 \leq 0.8$. The reasons are as follows. The band gaps of the clad layers 16, 17 and 19 and the guide layers 11 and 12 become greater as the Al composition grows higher. As set forth above, the band gap difference between the guide layers 11 and 12 and the clad layers 16, 17 and 19 may be set equal to or greater than a predetermined value in order to prevent the carriers from being excessively implanted into the active layer 10. The band gap difference can be made equal to or greater than the predetermined value by setting x1 greater than 0.7 and setting x2 equal to or smaller than 0.8.

If the end surface window structures 40 for expanding the band gap of the active layer 10 are formed in the laser resonator end surface portions, the band gap of the active layer 10 in the laser resonator end surface portions may become equal to the average value of the band gap of the resonator center portion and the band gap of the guide layers 11 and 12. In order to sufficiently expand the band gap of the active layer 10 in the end surface portions through the formation of the end surface window structures 40, the band gap of the guide layers 11 and 12 may be configured to be equal to or greater than a predetermined value (e.g., about 1.8 eV). The band gap of the guide layers 11 and 12 can be made equal to or greater than the predetermined value by setting x2 equal to or greater than 0.4.

In some embodiments, the thickness of the first p-type clad layer 17 may be not less than 300 nm and not greater than 400 nm. In some embodiments, if the thickness of the first p-type clad layer 17 is smaller than 300 nm, it is sometimes difficult to reduce the refractive index difference between the first p-type clad layer 17 and the active layer 10. Thus, a kink is generated with ease. In other alternate embodiments, if the thickness of the first p-type clad layer 17 is greater than 400 nm, the current flow path extending from the second p-type clad layer 19 to the active layer 10 may possibly become longer, thereby deteriorating the characteristics.

Figure 4:
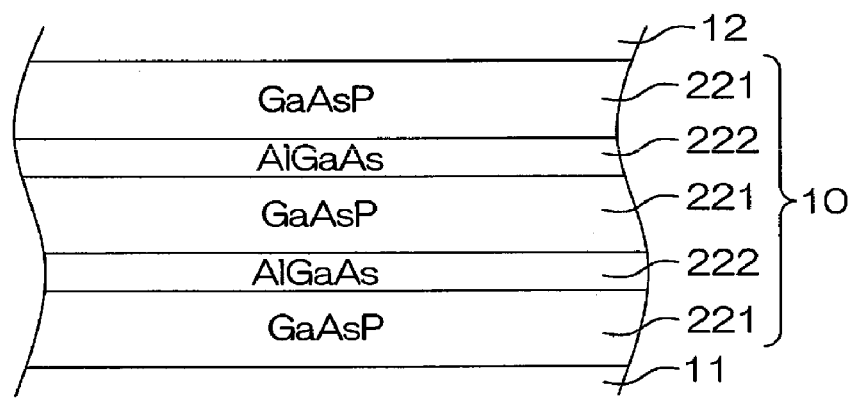
FIG. 4 is a diagrammatic section view for illustrating a configuration of an active layer of a semiconductor laser diode, according to some embodiments.

The active layer 10 may have a multiple-quantum well-structure containing, for example, AlGaAsP. The active layer 10 may be a layer for amplifying a light generated by the recombination of electrons and positive holes. In some embodiments, as shown in FIG. 4, the active layer 10 has a multiple-quantum well-structure formed by alternately and repeatedly laminating, through a plurality of cycles, shown as quantum well layers 221 and barrier layers 222 each containing an undoped $Al_{x2}Ga_{(1-x2)}As$ layer ($0 \leq x2 \leq 1$). In some embodiments, the quantum well layers 221 have a thickness of, for example, 9 nm to 12 nm or a thickness of 12 nm, but other widths are possible. The quantum well layers 221 also include an undoped $GaAs_{(1-x3)}P_{x3}$ layer ($0 \leq x3 \leq 1$). The barrier layers 222 include an undoped $Al_2Ga_{(1-x2)}As$ layer ($0 \leq x2 \leq 1$). The thickness of the barrier layers 222 may be set greater than 4 nm but smaller than the thickness of the quantum well layers 221. In some embodiments, the thickness of the barrier layers 222 is 6.5 nm. Similar to the guide layers 11 and 12, the $Al_{x2}Ga_{(1-x2)}As$ layers forming the barrier layers 222 may have a composition, where $0.4 \leq x2 \leq 0.8$.

Since the lattice constant of the GaAsP layers in an unstrained state is smaller than the lattice constant of the GaAs substrate 1, a tensile stress (or a tensile strain) is generated in each of the quantum well layers 221 containing the $GaAs_{(1-x3)}P_{x3}$ layer. This enables the semiconductor laser diode 70 to oscillate in a TM mode. The light outputted in the TM mode becomes a TM wave in which the magnetic field direction is perpendicular to the light propagation direction (namely, the electric field direction is parallel to the light propagation direction).

A tensile strain having a lattice mismatch rate of not greater than −0.4% and not less than −0.9% may be generated in each of the quantum well layers 221. In some embodiments, if the lattice mismatch rate is greater than −0.4% (if the tensile strain is small), the oscillation in the TM mode is sometimes difficult to achieve. In other alternate embodiments, if the lattice mismatch rate is smaller than −0.9% (if the tensile strain is large), crystal defects may sometimes be generated with ease. In another alternate embodiment, the oscillation wavelength may be not less than 780 nm and not greater than 830 nm, and the thickness of the quantum well layers 221 may be not less than 9 nm and not greater than 12 nm. If the oscillation wavelength and the thickness of the quantum well layers 221 satisfy the above-noted conditions, it is sometimes possible to keep a TM component light output greater than a TE component light output and to reduce a threshold current.

The $GaAs_{(1-x3)}P_{x3}$ layer forming the quantum well layers 221 may have a composition satisfying the conditions of the ratio x3/(1−x3), where the composition x3 of P to the composition (1−x3) of As is not less than 1/9 and not greater than 1/4. The reasons are as follows. In order to cause the semiconductor laser diode 70 to oscillate in the TM mode, a tensile strain may be generated in each of the quantum well layers 221. If the lattice constant of the quantum well layers 221 grows smaller, it is possible to generate a greater tensile strain in each of the quantum well layers 221. The lattice constant of the $GaAs_{(1-x3)}P_{x3}$ layer forming the quantum well layers 221 grows smaller as the ratio x3/(1−x3) of the composition of P to the composition of As becomes greater. In other words, if the ratio $x3/(1-x3)$ becomes larger, it is possible to generate a greater tensile strain in each of the quantum well layers 221.

The reason for the ratio $x3/(1-x3)$ being not less than 1/9 is to increase the ratio of the TM component light output to the TE component light output. The reason for the ratio $x3/(1-x3)$ being not greater than 1/4 is that, if the ratio $x3/(1-x3)$ is greater than 1/4, the tensile strain generated in each of the quantum well layers 221 due to the increase of the P composition becomes greater, which may possibly generate a crack and a leak current.

The number of the quantum well layers 221 may be not less than 2 and not greater than 5. If the number of the quantum well layers 221 is less than 2, the thickness of one of the quantum well layers 221 may be adjusted. Thus, crystal defects are generated with ease. On the other hand, if the number of the quantum well layers 221 is greater than 5, there exist an increased number of interfaces. Thus, crystal defects are generated with ease. As shown in FIG. 3, a ridge stripe 30 may be formed by partially removing the second p-type clad layer 19 and the p-type cap layer 20 existing within the p-type semiconductor layer 14. More specifically, the second p-type clad layer 19 and the p-type cap layer 20 are partially etched away to form a ridge stripe 30 having a substantially trapezoidal shape (mesa shape) when seen in a cross section view. In other words, the ridge stripe 30 is formed of the second p-type clad layer 19 and the p-type cap layer 20. The width of the surface of the second p-type clad layer 19 existing at the same side as the first p-type clad layer 17 (the first ridge width) will be referred to as "ridge bottom width W1". The width of the surface of the second p-type clad layer 19 existing at the opposite side from the first p-type clad layer 17 (the second ridge width) will be referred to as "ridge top width W2".

In some embodiments, the ridge bottom width W1 is not less than 3.0 μm and not greater than 4.5 μm, and, more specifically, equal to 3.5 μm. If the ridge bottom width W1 is less than 3.0 μm, carriers tend to concentrate on the widthwise central region of the semiconductor laser diode 70 during operation and the current density grows higher. Therefore, a kink is generated with ease. On the other hand, if the ridge bottom width W1 is greater than 4.5 μm, a current diffusing range becomes greater and a carrier supply shortage occurs during operation. Therefore, a kink is generated with ease. Since the ridge bottom width W1 is set not less than 3.0 μm and not greater than 4.5 μm, in some embodiments, it is possible to restrain or prevent generation of the kink. Accordingly, it is possible to obtain a semiconductor laser device with stable characteristics.

In some embodiments, the ridge top width W2 is not less than 2.0 μm, and more specifically, equal to 2.5 μm. If the ridge top width W2 is less than 2.0 μm, the resistance of the ridge stripe 30 becomes greater. The increase in the resistance of the ridge stripe 30 leads to an increase in an operating current and a decrease in a peak value of the light output. Since the ridge top width W2 is set not less than 2.0 μm, it is possible to reduce the resistance of the ridge stripe 30. This makes it possible to lower the operating current and to prevent the decrease in the peak value of the light output.

On the side surface of the ridge stripe 30, there is formed an n-type $(Al_{x4}Ga_{(1-x4)})_{0.51}In_{0.49}P$ ($0 \leq x4 \leq 1$) current-blocking layer (current-embedding layer) 6, which may have a thickness of 300 nm to 450 nm or a thickness of 400 nm, for example. More specifically, the side surfaces of the p-type cap layer 20, the exposed surfaces of the second p-type clad layer 19 and the exposed surfaces of the p-type etching stop layer 18 are covered with the n-type AlGaInP current-blocking layer 6 in an intermediate region other than the opposite end regions near the opposite end surfaces 31 and 32, as shown in FIG. 2. In some embodiments, the top and side surfaces of the p-type cap layer 20, the exposed surfaces of the second p-type clad layer 19 and the exposed surfaces of the p-type etching stop layer 18 are covered with the n-type AlGaInP current-blocking layer 6 in the opposite end regions, as shown in FIGS. 2 and 3. The n-type $(Al_{x4}Ga_{(1-x4)})_{0.51}In_{0.49}P$ current-blocking layer 6 becomes an n-type semiconductor layer by doping, e.g., utilizing Si as an n-type dopant, on $(Al_{x4}Ga_{(1-x4)})_{0.51}In_{0.49}P$.

In the intermediate region, the exposed surfaces of the n-type current-blocking layer 6 and the p-type cap layer 20 are covered with the contact layer 21. In the opposite end regions, the exposed surfaces of the n-type current-blocking layer 6 are covered with the contact layer 21. The n-type $(Al_{x4}Ga_{(1-x4)})_{0.51}In_{0.49}P$ ($0 \leq x4 \leq 1$) layer forming the current-blocking layer 6 may have a composition, where $0.7 \leq x4 \leq 0.9$. The reasons are as follows. If the Al composition in the n-type $(Al_{x4}Ga_{(1-x4)})_{0.51}In_{0.49}P$ ($0 \leq x4 \leq 1$) layer forming the current-blocking layer 6 becomes greater, the refractive index of the current-blocking layer 6 grows smaller. If x4 is smaller than 0.7, the refractive index difference between the first and second p-type clad layers 17 and 19 and the current-blocking layer 6 becomes smaller. This weakens the light confinement effect in the width direction provided by the current-blocking layer 6. Thus, the operating current grows larger and the peak output becomes smaller. On the other hand, if x4 is greater than 0.9, the refractive index difference between the first and second p-type clad layers 17 and 19 and the current-blocking layer 6 becomes too great. This makes too strong the light confinement effect in the width direction provided by the current-blocking layer 6. Thus, the light density is increased and the kink is generated with ease.

In some embodiments, the n-type $(Al_{x4}Ga_{(1-x4)})_{0.51}In_{0.49}P$ layer forming the current-blocking layer 6 has a composition, where $0.7 \leq x4 \leq 0.9$. It is therefore possible to prevent reduction of the peak output and to restrain or prevent generation of a kink. This makes it possible to obtain a semiconductor laser device which is suitable for high output and stable characteristics. In some embodiments, the thickness of the current-blocking layer 6 may be not less than 300 nm and not greater than 450 nm. If the thickness of the current-blocking layer 6 is less than 300 nm, it is likely that, when seen in a cross section view, the light beam emits toward the contact layer 21 beyond the current-blocking layer 6. On the other hand, if the thickness of the current-blocking layer 6 is greater than 450 nm, it becomes difficult to form the current-blocking layer 6. The semiconductor laminate structure 2 may have a pair of end surfaces (cleavage surfaces) 31 and 32 formed of the longitudinal opposite cleavage surfaces of the ridge stripe 30. The end surfaces 31 and 32 may be parallel to each other. Thus, the n-side guide layer 11, the active layer 10 and the p-side guide layer 12 make up a Fabry-Perot resonator in which the end surfaces 31 and 32 are used as resonator end surfaces. In other words, the light generated in the active layer 10 is amplified by inductive emission while traveling between the resonator end surfaces 31 and 32. The light thus amplified is partially emitted, as laser light, from the resonator end surfaces 31 and 32 to the outside of the semiconductor laser device.

The n-type electrode 3 may be made of, for example, an AuGe/Ni/Ti/Au alloy, and may be ohmic-joined to the substrate 1 so that the AuGe side thereof can be positioned at the rear side of the substrate 1. The p-type electrode 4 may be made of, for example, a Ti/Au alloy, and may be ohmic-joined to the p-type contact layer 21 so that the Ti side thereof can be positioned on the p-type contact layer 21. As shown in FIGS. 1 and 2, the end surface window structures 40 for expanding the band gap of the active layer 10 may be formed in the end surface window portions of the resonator. The end surface window structures 40 may be formed by, for example, diffusing zinc (Zn) into the resonator end surface portions. The diffusion length L of zinc from the interface between the n-side guide layer 11 and the n-type clad layer 16 toward the n-type clad layer 16 may be not less than 400 nm and not greater than 1300 nm. In some embodiments, if the diffusion length L is less than 400 nm, it sometimes becomes difficult to obtain the effect provided by the end surface window structures. In other alternate embodiments, if the diffusion length L is greater than 1300 nm, the diffusion amount of impurities (zinc in this case) sometimes becomes larger, which may possibly result in deterioration of characteristics.

With the configuration described above, the n-type electrode 3 and the p-type electrode 4 are connected to a power source. Electrons and positive holes are implanted from the n type semiconductor layer 13 and the p-type semiconductor layer 14 into the active layer 10, whereby the electrons and the positive holes are recombined within the active layer 10. This makes it possible to generate light having an oscillation wavelength of, e.g., not less than 780 nm and not greater than 830 nm, but other wavelengths are possible. The light is amplified by inductive emission while repeating traveling between the resonator end surfaces 31 and 32 along the guide layers 11 and 12. Then, a greater laser output is taken out from the resonator end surface 31 as a laser emitting surface.

Figure 5:
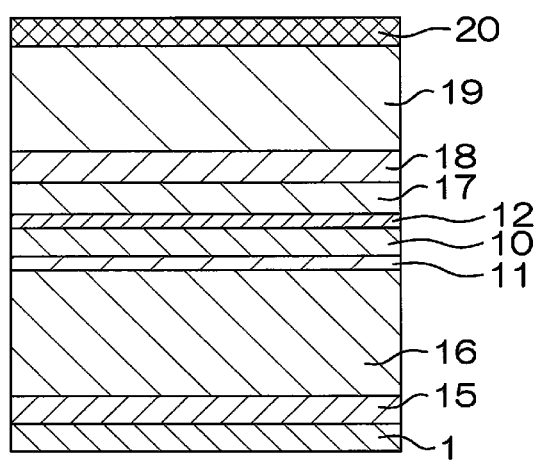
FIG. 5 is a section view illustrating a manufacturing step of a semiconductor laser diode, according to some embodiments.
Figure 6:
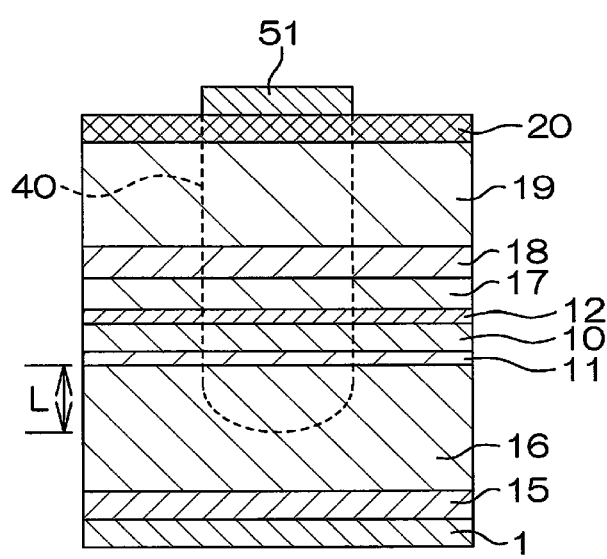
FIG. 6 is a section view illustrating a manufacturing step of a semiconductor laser diode, according to some other embodiments.
Figure 8:
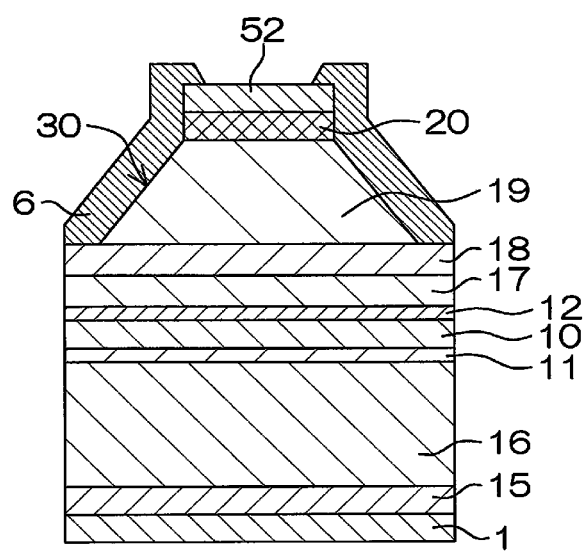
FIG. 8 is a section view illustrating a manufacturing step of a semiconductor laser diode, according to some other embodiments.
Figure 9:
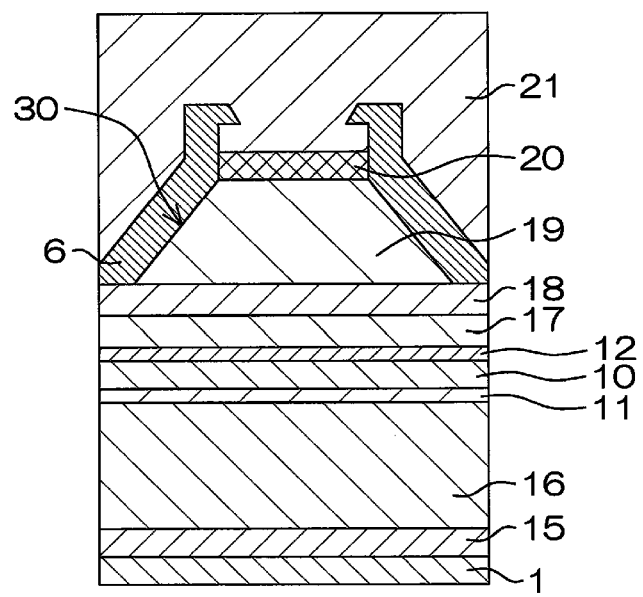
FIG. 9 is a section view illustrating a manufacturing step of a semiconductor laser diode, according to some other embodiments.
Figure 10:
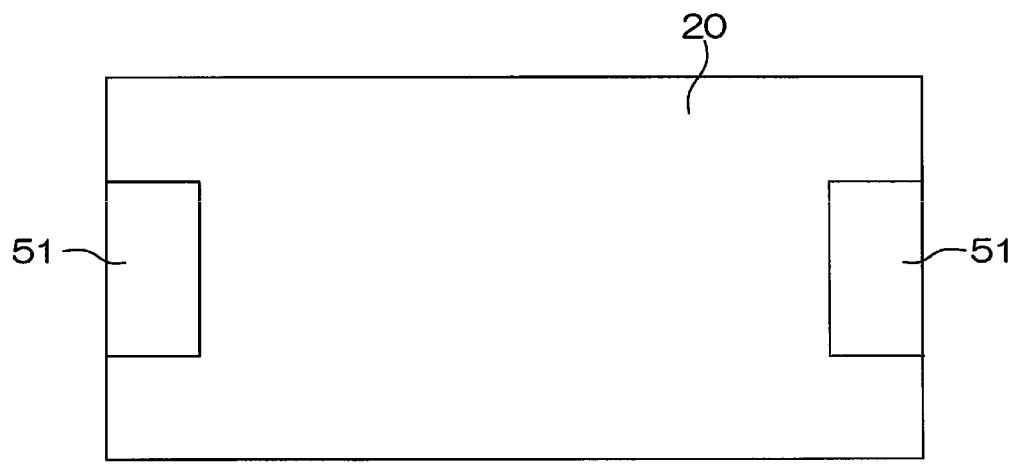
FIG. 10 is a plan view illustrating a manufacturing step of a semiconductor laser diode, according to some embodiments.
Figure 11:
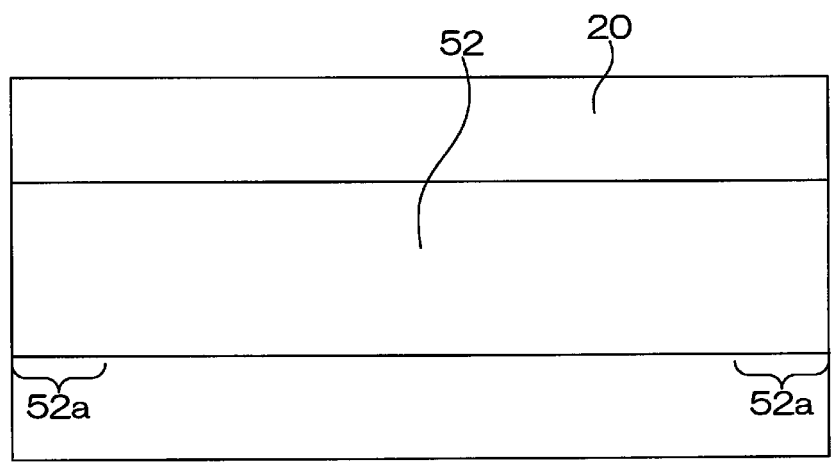
FIG. 11 is a plan view illustrating a manufacturing step of a semiconductor laser diode, according to some other embodiments.

FIGS. 5 through 11 are horizontal section views showing a manufacturing method of the semiconductor laser diode 70 shown in FIGS. 1 through 3. FIGS. 5, 7, 8 and 9 are horizontal section views of the central portion, which correspond to FIG. 3. FIG. 6 is a horizontal section view of the portion near the opposite ends. FIGS. 10 and 11 are plan views.

As shown in FIG. 5, an n-type GaAs buffer layer 15, an n-type $(Al_{x1}Ga_{(1-x1)})_{0.51}In_{0.49}P$ clad layer 16, an n-side $Al_{x2}Ga_{(1-x2)}As$ guide layer 11, an active layer 10, a p-side $Al_2Ga_{(1-x2)}As$ guide layer 12, a first p-type $(Al_{x1}Ga_{(1-x1)})_{0.51}In_{0.49}P$ clad layer 17, a p-type InGaP etching stop layer 18, a second p-type $(Al_{x1}Ga_{(1-x1)})_{0.51}In_{0.49}P$ clad layer 19 and a p-type GaAs cap layer 20 may be grown on a GaAs substrate 1 one after another by MOCVD (metal organic chemical vapor deposition) (a first crystal growth step). The active layer 10 is formed by causing quantum well layers 221 each including a $GaAs_{(1-x3)}P_{x3}$ layer and barrier layers 222 each including a $Al_2Ga_{(1-x2)}As$ layer to alternately and repeatedly grow through a plurality of cycles.

Next, as shown in FIGS. 6 and 10, a ZnO (zinc oxide) layer 51 may be patterned on the p-type GaAs cap layer 20 in the regions near the end surfaces of the semiconductor laser diode 70. Then, Zn is diffused into the regions near the end surfaces of the semiconductor laser diode 70 by, for example, performing an annealing treatment for about two hours at a temperature of 500 to 600 degrees Celsius. At this time, the annealing treatment may be performed such that the diffusion length L of Zn from the interface between the n-side guide layer 11 and the n-type clad layer 16 toward the n-type clad layer 16 falls within a range of from 400 nm to 1300 nm. Thus, end surface window structures 40 can be formed in the regions near the end surfaces of the semiconductor laser diode 70.

Figure 7:
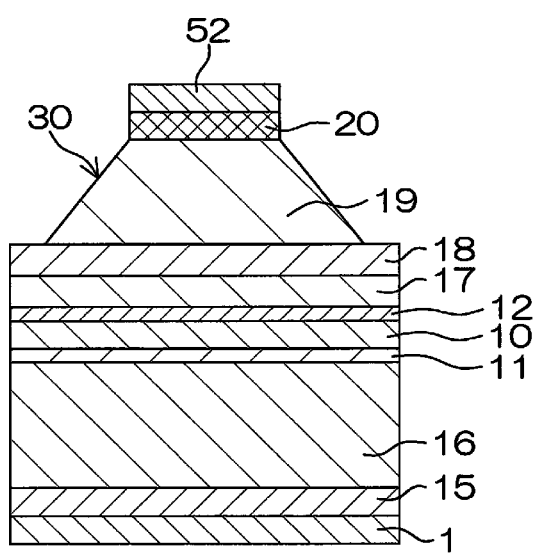
FIG. 7 is a section view illustrating a manufacturing step of a semiconductor laser diode, according to some other embodiments.

Next, the ZnO layer 51 may be removed. Subsequently, as shown in FIGS. 7 and 11, the p-type cap layer 20 and the second p-type clad layer 19 may be partially removed through an etching step in which a stripe-shaped $SiO_2$ insulation film is used as a mask layer 52. Thus, a ridge stripe 30 having the mask layer 52 on the top surface thereof may be formed. After forming the ridge stripe 30, only the portions 52a (see FIG. 11) of the mask layer 52 existing in the regions near the end surfaces of the semiconductor laser diode 70 may be removed.

Next, as shown in FIG. 8, an n-type $(Al_{x4}Ga_{(1-x4)})_{0.51}In_{0.49}P$ current-blocking layer 6 may be formed on the surface of the ridge stripe 30 (a second crystal growth step). At this time, the mask layer 52 serves as a mask. For that reason, as shown in FIG. 8, the top surface of the ridge stripe 30 (the upper surface of the p-type cap layer 20) may not covered with the n-type current-blocking layer 6 in the region corresponding to the intermediate portion between the opposite end portions of the semiconductor laser diode 70. Since the mask layer 52 does not exist in the regions near the end surfaces of the semiconductor laser diode 70, the top surface of the ridge stripe 30 (the upper surface of the p-type cap layer 20) may be covered with the n-type current-blocking layer 6 in the regions near the end surfaces of the semiconductor laser diode 70.

Thereafter, the mask layer 52 may be removed. Then, as shown in FIG. 9, a p-type GaAs contact layer 21 may be grown on the surfaces of the n-type current-blocking layer 6 and the p-type cap layer 20 (a third crystal growth step). Finally, a p-type electrode 4 making ohmic contact with the p-type GaAs contact layer 21 may be formed and an n-type electrode 3 making ohmic contact with the GaAs substrate 1 may be formed.

Next, description will be made on the relationship between the tensile strain amount [%] and the polarization ratio [dB] of the quantum well layers 221. In this regard, the polarization ratio may be represented by an equation: polarization ratio=10 LOG (TM component light output/TE component light output).

The polarization ratio may be determined utilizing any combination of parameters. For illustration purposes, the following four scenarios are provided:

a: semiconductor laser device including an active layer 10, the quantum well layers 221 having a thickness from 9 nm to 12 nm, and an oscillation wavelength from 820 nm to 830 nm;

b: semiconductor laser device including an active layer 10, the quantum well layers 221 having a thickness from 9 nm to 12 nm, and an oscillation wavelength from 800 nm to 820 nm;

c: semiconductor laser device including an active layer 10, the quantum well layers 221 having a thickness from 9 nm to 12 nm, and an oscillation wavelength from 790 nm to 800 nm; and d: semiconductor laser device including an active layer 10, the quantum well layers 221 having a thickness from 9 nm to 12 nm, and an oscillation wavelength from 780 nm to 790 nm. The absolute values of the tensile strain amounts [%] of the active layers 10 for the sample scenarios are a<b<c<d. In other words, the tensile strain of sample a is smallest and the tensile strain of sample d is greatest.

Additionally, the conducting condition may be 60 mW at 25 degrees Celsius. The measurement results of polarization ratios [dB] with respect to samples a through d are shown in Table 1. When the tensile strain amount [%] of the quantum well layers 221 is zero, the polarization ratio [dB] is approximately −35.

TABLE 1

| Sample | Polarization Ratio [dB] |
|--------|-------------------------|
| a | 8 |
| b | 25 |
| c | 25 |
| d | 26 |

It can be noted from Table 1 that the polarization ratios [dB] of all the samples are positive and further that the TM component light output is greater than the TE component light output in all the samples. The following section below describes the relationship between the tensile strain amount [%] of the active layer 10 and the threshold current [mA]. Using the same sample scenarios a through d above, and a conducting condition at 25 degrees Celsius, the measurements of threshold currents [mA] with respect to samples a through d are shown in Table 2. When the tensile strain amount [%] of the quantum well layers 221 is zero, the threshold current [mA] is approximately 24.5 mA.

TABLE 2

| Sample | Threshold Current [mA] |
|---|---|
| a | 21 |
| b | 18.9 |
| c | 17 |
| d | 18.2 |

It can be noted in Table 2 that the threshold currents [mA] of all the samples are lower than the threshold current available when the tensile strain amount [%] is zero. These results reveal that, in some embodiments, if the thickness of the quantum well layers 221 is not less than 9 nm and not greater than 12 nm with the oscillation wavelength being not less than 780 nm and not greater than 830 nm, the TM component light output becomes greater than the TE component light output and the threshold current can be kept low.

Figure 12:
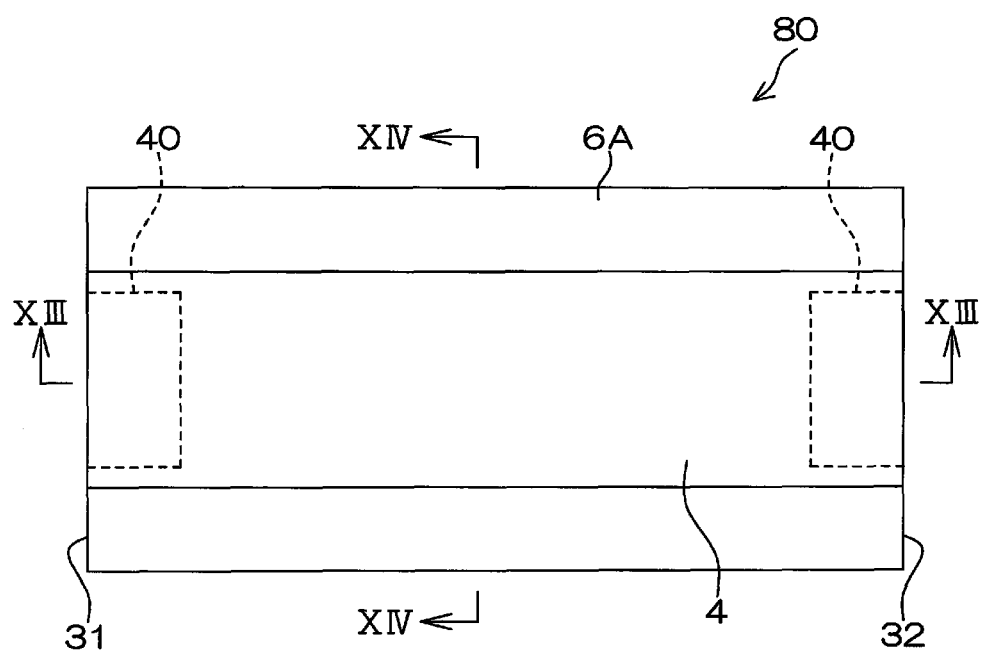
FIG. 12 is a plan view for illustrating the configuration of a semiconductor laser diode, according to some other embodiments.
Figure 13:
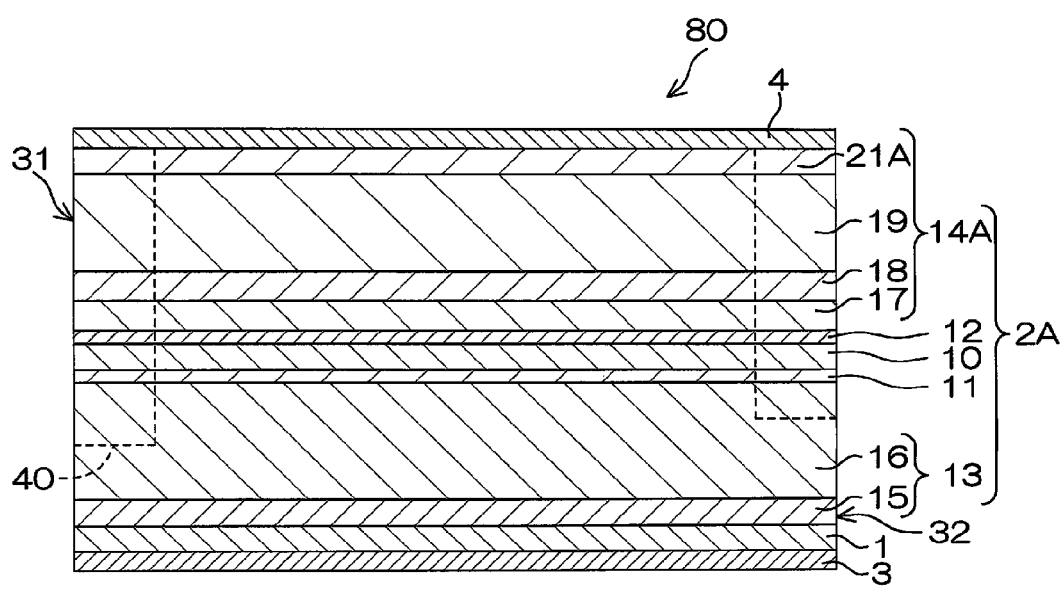
FIG. 13 is a section view taken along line XIII-XIII in FIG. 12.
Figure 14:
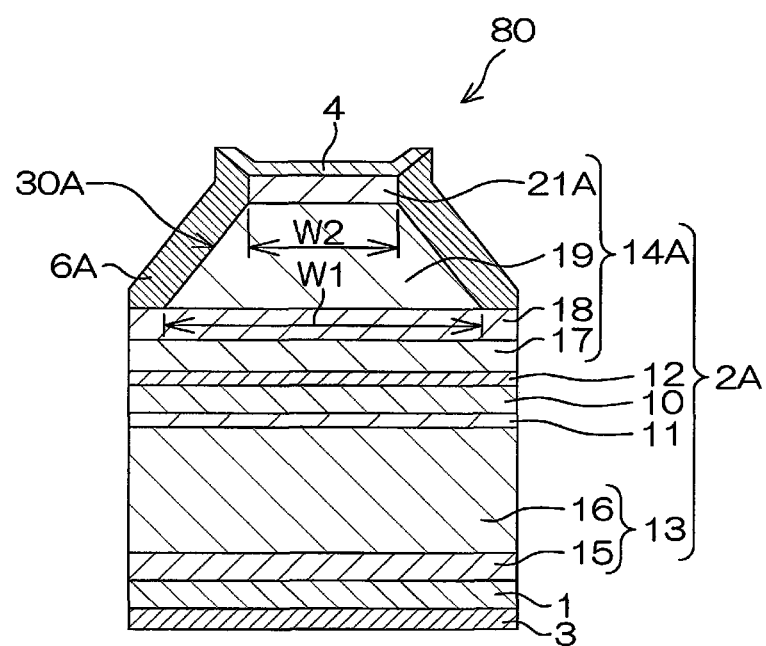
FIG. 14 is a section view taken along line XIV-XIV in FIG. 12.

FIG. 12 is a plan view for illustrating the configuration of a semiconductor laser diode according some embodiments. FIG. 13 is a section view taken along line XIII-XIII in FIG. 12. FIG. 14 is a section view taken along line XIV-XIV in FIG. 12. In FIGS. 12 through 14, the portions corresponding to the respective portions shown in FIGS. 1 through 3 are designated by the same reference numerals as used in FIGS. 1 through 3.

In some embodiments, the semiconductor laser diode 80 may be a one-time-grown semiconductor laser diode manufactured through a one-time crystal growth step. For example, the semiconductor laser diode 80 is a Fabry-Perot type semiconductor laser diode including a substrate 1, a semiconductor laminate structure 2A formed on the substrate 1 by crystal growth, an n-type electrode 3 formed in contact with the rear surface of the substrate 1 (the opposite surface of the substrate 1 from the semiconductor laminate structure 2A) and a p-type electrode 4 formed in contact with the front surface of the semiconductor laminate structure 2A.

In some embodiments, the substrate 1 is formed of a GaAs monocrystalline substrate. The plane direction of the front surface of the GaAs substrate 1 has an off-angle of 10 degrees with respect to a (100) plane. Individual layers making up the semiconductor laminate structure 2A are caused to epitaxially grow with respect to the substrate 1.

The semiconductor laminate structure 2A includes an active layer 10, an n-side guide layer 11, a p-side guide layer 12, an n-type semiconductor layer 13 and a p-type semiconductor layer 14A. The n-type semiconductor layer 13 is arranged on the substrate 1 facing the active layer 10. The p-type semiconductor layer 14A is arranged between the active layer 10 and the p-type electrode 4. The n-side guide layer 11 is arranged between the n-type semiconductor layer 13 and the active layer 10. The p-side guide layer 12 is arranged between the active layer 10 and the p-type semiconductor layer 14A. Thus, there is formed a double heterojunction. Electrons are implanted into the active layer 10 from the n-type semiconductor layer 13 via the n-side guide layer 11. Positive holes are implanted into the active layer 10 from the p-type semiconductor layer 14A via the p-side guide layer 12. Light is emitted as the electrons and the positive holes are recombined in the active layer 10.

The n-type semiconductor layer 13 is formed by laminating an n-type GaAs buffer layer 15 and an n-type $(Al_{x1}Ga_{(1-x1)})_{0.51}In_{0.49}P$ clad layer ($0 \leq x1 \leq 1$) 16 in the named order from the side of the substrate 1. The n-type GaAs buffer layer 15 has a thickness of, for example, 50 nm to 100 nm or a thickness of 100 nm. The n-type $(Al_{x1}Ga_{(1-x1)})_{0.51}In_{0.49}P$ clad layer ($0 \leq x1 \leq 1$) 16 has a thickness of, for example, 2000 nm to 3000 nm or a thickness of 2500 nm. On the other hand, the p-type semiconductor layer 14A may be formed by laminating, on the p-type guide layer 12, a first p-type $(Al_{x1}Ga_{(1-x1)})_{0.51}In_{0.49}P$ clad layer ($0 \leq x1 \leq 1$) 17, a p-type InGaP etching stop layer 18, a second p-type $(Al_{x1}Ga_{(1-x1)})_{0.51}In_{0.49}P$ clad layer ($0 \leq x1 \leq 1$) 19, and a p-type GaAs contact layer 21A. The first p-type $(Al_{x1}Ga_{(1-x1)})_{0.51}In_{0.49}P$ clad layer ($0 \leq x1 \leq 1$) 17 has a thickness of, for example, 250 nm to 400 nm or a thickness of 350 nm. The p-type InGaP etching stop layer 18 has a thickness of, for example, 5 nm to 10 nm or a thickness of 5 nm. The second p-type $(Al_{x1}Ga_{(1-x1)})_{0.51}In_{0.49}P$ clad layer ($0 \leq x1 \leq 1$) 19 has a thickness of, for example, 1000 nm to 1500 nm or a thickness of 1000 nm. The p-type GaAs contact layer 21A has a thickness of, for example, 100 nm to 300 nm or a thickness of 300 nm.

The n-side guide layer 11 may be formed of a $Al_{x2}Ga_{(1-x2)}As$ ($0 \leq x2 \leq 1$) layer (having a thickness of, e.g., 20 nm to 30 nm, or a thickness of 20 nm) and is laminated on the n-type semiconductor layer 13. The p-side guide layer 12 is formed of a $Al_2Ga_{(1-x2)}As$ ($0 \leq x2 \leq 1$) layer (having a thickness of, e.g., 20 nm to 30 nm, or a thickness of 20 nm) and is laminated on the active layer 10.

The $(Al_{x1}Ga_{(1-x1)})_{0.51}In_{0.49}P$ layer forming each of the clad layers 16, 17 and 19 may have a composition, where x1>0.7. The reasons are as follows. The band gaps of the clad layers 16, 17 and 19 may become greater as the Al composition grows higher. As set forth above, the band gap difference between the guide layers 11 and 12 and the clad layers 16, 17 and 19 may be set equal to or greater than a predetermined value in order for the clad layers 16, 17 and 19 to satisfactorily perform carrier blocking and light confinement. The band gap difference can be made equal to or greater than the predetermined value by setting x1 greater than 0.7.

The thickness of the first p-type clad layer 17 may be not less than 300 nm and not greater than 400 nm not to generate a kink easily. In some embodiments, if the thickness of the first p-type clad layer 17 is smaller than 300 nm, it is sometimes difficult to reduce the refractive index difference between the first p-type clad layer 17 and the active layer 10. In other alternate embodiments, if the thickness of the first p-type clad layer 17 is greater than 400 nm, the current flow path extending from the second p-type clad layer 19 to the active layer 10 sometimes becomes longer, thereby deteriorating the characteristics.

The active layer 10 has a multiple-quantum well structure containing, e.g., AlGaAsP. In some embodiments, as shown in FIG. 4, the active layer 10 has a multiple-quantum well structure formed by alternately and repeatedly laminating, through a plurality of cycles, quantum well layers 221 and barrier layers 222. The quantum well layers 221 have a thickness of, for example, 8 nm to 14 nm or a thickness of 13 nm, and may include undoped $GaAs_{(1-x3)}P_{x3}$ layers ($0 \leq x3 \leq 1$). The barrier layers 222 may include undoped $Al_2Ga_{(1-2)}As$ layers ($0 \leq x2 \leq 1$). The thickness of the barrier layers 222 may be set greater than 4 nm but smaller than the thickness of the quantum well layers 221. In some embodiments, the thickness of the barrier layers 222 is 6.5 nm.

Since the lattice constant of the GaAsP layers in an unstrained state is smaller than the lattice constant of the GaAs substrate 1, a tensile stress (or a tensile strain) is generated in each of the quantum well layers 221 including the GaAs$_{(1-x3)}$P$_{x3}$ layer. This enables the semiconductor laser diode 80 to oscillate in a TM mode. The light outputted in the TM mode becomes a TM wave in which the magnetic field direction is perpendicular to the light propagation direction. Namely, the electric field direction is parallel to the light propagation direction.

A ridge stripe 30A is formed by partially removing the second p-type clad layer 19 and the p-type contact layer 21A existing within the p-type semiconductor layer 14A. More specifically, the second p-type clad layer 19 and the p-type contact layer 21A may be partially etched away to form a ridge stripe 30A having a substantially trapezoidal shape (mesa shape) when seen in a cross section view. In other words, the ridge stripe 30A may be formed of the second p-type clad layer 19 and the p-type contact layer 21A. The width of the surface of the second p-type clad layer 19 existing at the same side as the first p-type clad layer 17 (the first ridge width) will be referred to as "ridge bottom width W1". The width of the surface of the second p-type clad layer 19 existing at the opposite side from the first p-type clad layer 17 (the second ridge width) will be referred to as "ridge top width W2".

In some embodiments, the ridge bottom width W1 is not less than 3.0 μm and not greater than 4.5 μm, and more specifically, equal to 3.5 μm. If the ridge bottom width W1 is less than 3.0 μm, carriers tend to concentrate on the widthwise central region of the semiconductor laser diode 80 during operation and the current density grows higher. The increase in the current density causes sudden current implantation, which may possibly generate a kink. On the other hand, if the ridge bottom width W1 is greater than 4.5 μm, a current diffusing range becomes greater during operation. The increase in the current diffusing range leads to carrier shortage, which may possibly generate a kink. Since the ridge bottom width W1 is set not less than 3.0 μm and not greater than 4.5 μm, in some embodiments, it is possible to restrain or prevent generation of the kink. Accordingly, it is possible to obtain a semiconductor laser device with stable characteristics.

The ridge top width W2 is not less than 2.0 μm, and more specifically, equal to 2.5 μm. If the ridge top width W2 is less than 2.0 μm, the resistance of the ridge stripe 30A becomes greater. The increase in the resistance of the ridge stripe 30A leads to an increase in an operating current and a decrease in a peak value of the light output. Since the ridge top width W2 is set not less than 2.0 μm, in some embodiments, it is possible to reduce the resistance of the ridge stripe 30A. This makes it possible to lower the operating current and to prevent the decrease in the peak value of the light output.

On the side surface of the ridge stripe 30A, there is formed a current-blocking layer (embedding layer) 6A, which has a thickness of, e.g., 200 nm to 300 nm, or a thickness of 250 nm and contains a SiO$_2$ or SiN insulation layer. More specifically, the side surfaces of the p-type contact layer 21A, the exposed surfaces of the second p-type clad layer 19 and the exposed surfaces of the p-type etching stop layer 18 may be covered with the current-blocking layer 6A.

The thickness of the current-blocking layer 6A may be not less than 200 nm and not greater than 300 nm. If the thickness of the current-blocking layer 6A is less than 200 nm, it is likely that, when seen in a cross section view, the light beam emits from the current-blocking layer 6A. On the other hand, if the thickness of the current-blocking layer 6A is greater than 300 nm, a stress is generated in the active layer 10 due to the difference in thermal expansion coefficient between the current-blocking layer 6A and the active layer 10. This is because the SiO$_2$ or SiN insulation layer is hard. Consequently, it is likely that the magnitude of the tensile strain generated in the active layer 10 may undergo a change.

In some embodiments, the semiconductor laminate structure 2A has a pair of end surfaces (cleavage surfaces) 31 and 32 formed of the longitudinal opposite cleavage surfaces of the ridge stripe 30A. The end surfaces 31 and 32 are parallel to each other. Thus, the n-side guide layer 11, the active layer 10 and the p-side guide layer 12 make up a Fabry-Perot resonator in which the end surfaces 31 and 32 are used as resonator end surfaces. In other words, the light generated in the active layer 10 is amplified by inductive emission while repeating traveling between the resonator end surfaces 31 and 32. The light thus amplified is partially emitted, as laser light, from the resonator end surfaces 31 and 32 to the outside of the semiconductor laser device.

The n-type electrode 3 may be made of, e.g., an AuGe/Ni/Ti/Au alloy, and is ohmic-joined to the substrate 1 so that the AuGe side thereof can be positioned at the rear side of the substrate 1. But other substitute materials may be possible. The p-type electrode 4 may be made of, e.g., a Ti/Au alloy, and is ohmic-joined to the p-type contact layer 21A so that the Ti side thereof can be positioned on the p-type contact layer 21A. Again, other substitute materials may be possible. As shown in FIGS. 12 and 13, the end surface window structures 40 for expanding the band gap of the active layer 10 may be formed in the end surface portions of the resonator. The end surface window structures 40 may be formed by, e.g., diffusing zinc (Zn) into the resonator end surface portions.

With the configuration described above, the n-type electrode 3 and the p-type electrode 4 are connected to a power source. Electrons and positive holes are implanted from the n type semiconductor layer 13 and the p-type semiconductor layer 14A into the active layer 10, whereby the electrons and the positive holes are recombined within the active layer 10. This makes it possible to generate light having an oscillation wavelength of, e.g., not less than 770 nm and not greater than 830 nm. The light is amplified by inductive emission while repeating traveling between the resonator end surfaces 31 and 32 along the guide layers 11 and 12. Then, a greater laser output is taken out from the resonator end surface 31 as a laser emitting surface.

Figure 15:
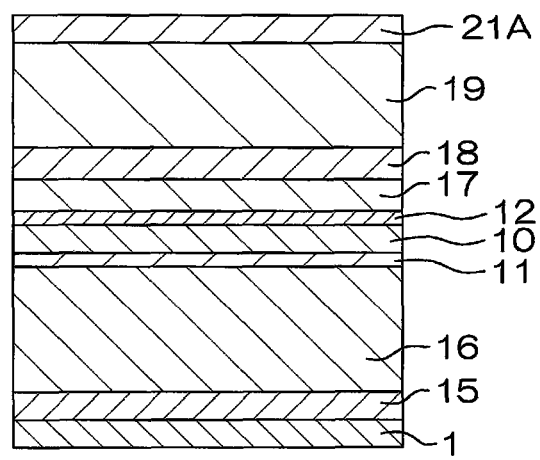
FIG. 15 is a section view illustrating a manufacturing step of a semiconductor laser diode, according to some other embodiments.
Figure 16:
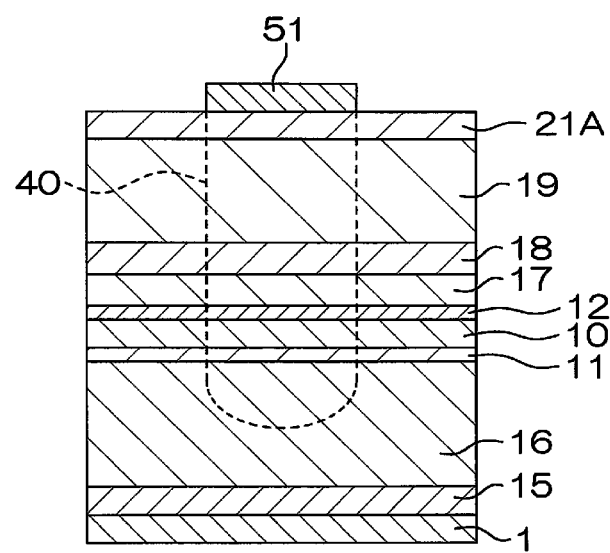
FIG. 16 is a section view illustrating a manufacturing step of a semiconductor laser diode, according to some other embodiments.
Figure 17:
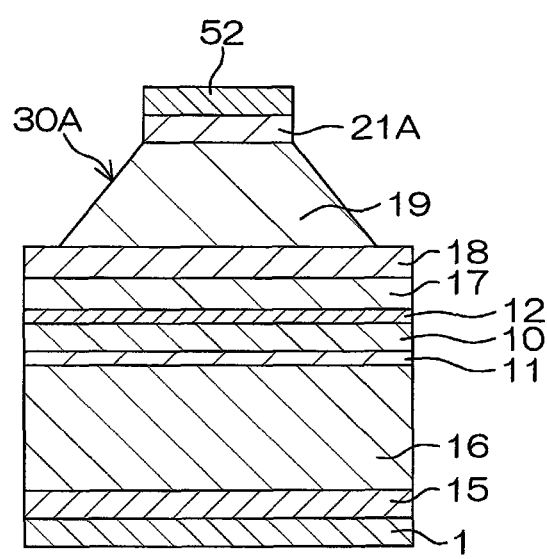
FIG. 17 is a section view illustrating a manufacturing step of a semiconductor laser diode, according to some other embodiments.
Figure 18:
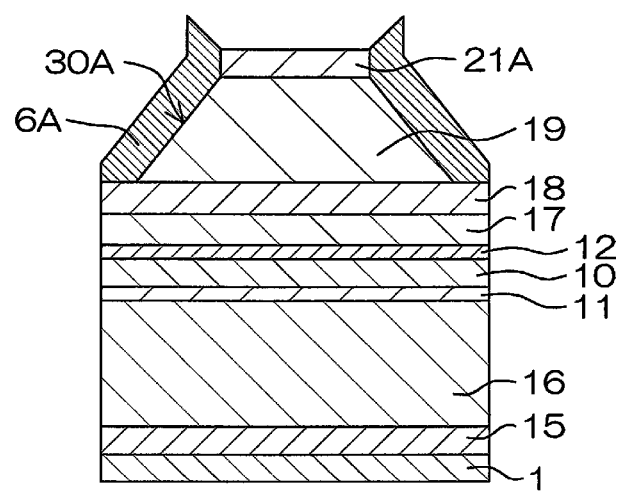
FIG. 18 is a section view illustrating a manufacturing step of a semiconductor laser diode, according to some other embodiments.
Figure 19:
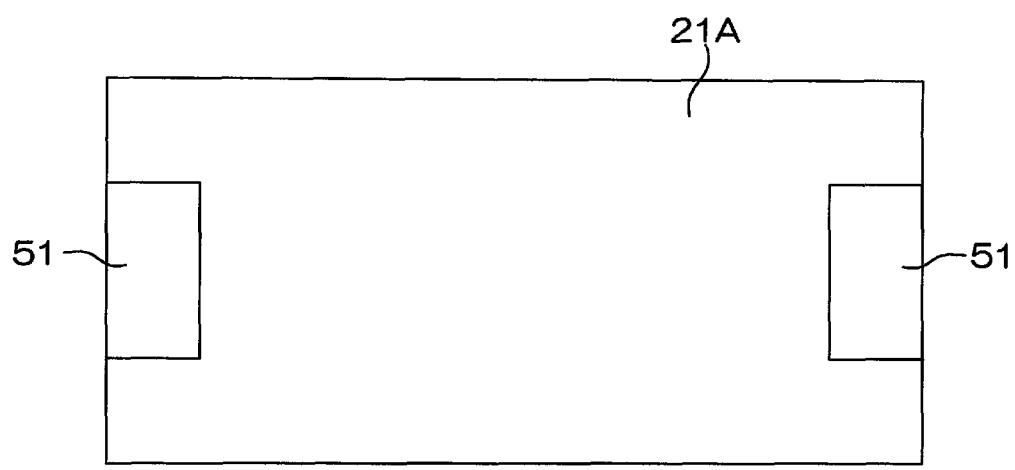
FIG. 19 is a plan view illustrating a manufacturing step of a semiconductor laser diode, according to some other embodiments.
Figure 20:
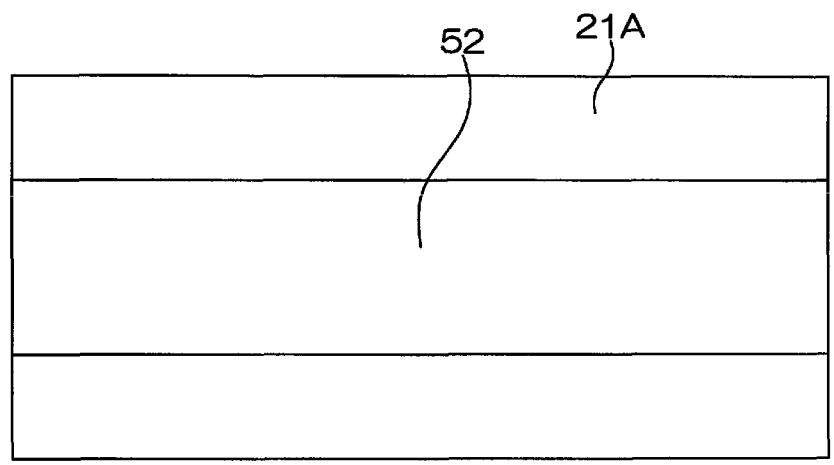
FIG. 20 is a plan view illustrating a manufacturing step of a semiconductor laser diode, according to some other embodiments.

FIGS. 15 through 20 are horizontal section views showing a manufacturing method of the semiconductor laser diode 80 shown in FIGS. 12 through 14, according to some embodiments. FIGS. 15, 17 and 18 are horizontal section views of the central portion, which correspond to FIG. 4. FIG. 16 is a horizontal section view of the portion near the opposite ends. FIGS. 19 and 20 are plan views. First, as shown in FIG. 15, an n-type GaAs buffer layer 15, an n-type (Al$_{x1}$Ga$_{(1-x1)}$)$_{0.51}$In$_{0.49}$P clad layer 16, an n-side Al$_2$Ga$_{(1-x2)}$As guide layer 11, an active layer 10, a p-side Al$_2$Ga$_{(1-x2)}$As guide layer 12, a first p-type (Al$_{x1}$Ga$_{(1-x1)}$)$_{0.51}$In$_{0.49}$P clad layer 17, a p-type InGaP etching stop layer 18, a second p-type (Al$_{x1}$Ga$_{(1-x1)}$)$_{0.51}$In$_{0.49}$P clad layer 19 and a p-type GaAs contact layer 21A may be grown on a GaAs substrate 1 one after another by metal organic chemical vapor deposition. The active layer 10 may be formed by causing quantum well layers 221 each including a GaAs$_{(1-x3)}$P$_{x3}$ layer and barrier layers 222 each including a Al$_2$Ga$_{(1-x2)}$As layer to alternately and repeatedly grow through a plurality of cycles.

Next, as shown in FIGS. 16 and 19, a ZnO (zinc oxide) layer 51 may be patterned on the p-type GaAs contact layer 21A in the regions near the ends of the semiconductor laser diode 80. Then, Zn is diffused into the regions near the end surfaces of the semiconductor laser diode 80 by, e.g., performing an annealing treatment for about two hours at a temperature of 500 to 600 degrees Celsius. Thus, end surface window structures 40 may be formed in the regions near the end surfaces of the semiconductor laser diode 80.

Next, the ZnO layer 51 is removed. Subsequently in some embodiments, as shown in FIGS. 17 and 20, the p-type contact layer 21A and the second p-type clad layer 19 are partially removed through an etching step in which a stripe-shaped $SiO_2$ insulation film is used as a mask layer 52. Thus, a ridge stripe 30A having the mask layer 52 on the top surface thereof may be formed. Thereafter, the mask layer 52 is removed. Next, an n-type current-blocking layer 6A containing a $SiO_2$ or SiN insulation layer is formed on the surface of the ridge stripe 30A. Thereafter, the current-blocking layer 6A on the p-type contact layer 21A is removed. Thus, as shown in FIG. 18, the side surfaces of the ridge stripe 30A are covered with the current-blocking layer 6A but the top surface of the ridge stripe 30A (the upper surface of the p-type contact layer 21A) may not be covered with the current-blocking layer 6A.

Finally, a p-type electrode 4 making ohmic contact with the p-type GaAs contact layer 21A may be formed and an n-type electrode 3 making ohmic contact with the GaAs substrate 1 may be formed.

The present disclosure(s) may be modified in many different forms without departing from the scope thereof defined in the claims.

While certain embodiments have been described, these embodiments have been presented by way of example only, and are not intended to limit the scope of the disclosures. Indeed, the novel devices described herein may be embodied in a variety of other forms and may be combined; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor laser device, comprising:
   a p-type clad layer and an n-type clad layer;
   a p-side guide layer and an n-side guide layer interposed between the p-type clad layer and the n-type clad layer; and
   an active layer interposed between the p-side guide layer and the n-side guide layer, the active layer including at least two quantum well layers and a barrier layer interposed between the quantum well layers adjoining to each other, each of the p-type clad layer and the n-type clad layer being formed of a $(Al_{x1}Ga_{(1-x1)})_{0.51}In_{0.49}P$ layer ($0 \leq x1 \leq 1$), each of the p-side guide layer, the n-side guide layer and the barrier layer being formed of a $Al_{x2}Ga_{(1-x2)}As$ layer ($0 \leq x2 \leq 1$), each of the quantum well layers being formed of a $GaAs_{(1-x3)}P_{x3}$ layer ($0 \leq x3 \leq 1$).

2. The device of claim 1, wherein the $(Al_{x1}Ga_{(1-x1)})_{0.51}In_{0.49}P$ layer has a composition where $x1 > 0.7$, and the $Al_{x2}Ga_{(1-x2)}As$ layer has a composition where $0.4 \leq x2 \leq 0.8$.

3. The device of claim 1, wherein a tensile strain having a lattice mismatch rate of not greater than −0.4% and not less than −0.9% is generated in each of the quantum well layers.

4. The device of claim 1, wherein the active layer has an oscillation wavelength of not less than 780 nm and not greater than 830 nm, and each of the quantum well layers has a thickness of not less than 9 nm and not greater than 12 nm.

5. The device of claim 1, wherein the $GaAs_{(1-x3)}P_{x3}$ layer has a composition satisfying a condition that a ratio x3/(1−x3) of a composition x3 of P to a composition (1−x3) of As is not less than 1/9 and not greater than 1/4.

6. The device of claim 1, wherein each of the quantum well layers has a thickness of not less than 9 nm and not greater than 12 nm, the barrier layer having a thickness smaller than the thickness of each of the quantum well layers.

7. The device of claim 1, wherein the number of the quantum well layers is not less than 2 and not greater than 5.

8. The device of claim 1, wherein the p-type clad layer and the n-type clad layer have a carrier concentration of not less than $0.7 \times 10^{18}$ cm$^{-3}$ and not greater than $2.0 \times 10^{18}$ cm$^{-3}$.

9. The device of claim 1, wherein one or more end surface window structures for expanding a band gap of the active layer are formed in one or more end surface portions of a laser resonator.

10. The device of claim 9, wherein the one or more end surface window structures are formed by selectively diffusing one or more impurities into the one or more end surface portions of the laser resonator, and a diffusion length of the impurities from an interface between the n-side guide layer and the n-type clad layer toward the n-type clad layer is not less than 400 nm and not greater than 1300 nm.

11. A method of manufacturing a semiconductor laser device, comprising:
    forming a p-type clad layer and an n-type clad layer;
    forming a p-side guide layer and an n-side guide layer interposed between the p-type clad layer and the n-type clad layer; and
    interposing an active layer between the p-side guide layer and the n-side guide layer, the active layer including at least two quantum well layers and a barrier layer interposed between the quantum well layers adjoining to each other, each of the p-type clad layer and the n-type clad layer being formed of a $(Al_{x1}Ga_{(1-x1)})_{0.51}In_{0.49}P$ layer ($0 \leq x1 \leq 1$), each of the p-side guide layer, the n-side guide layer and the barrier layer being formed of a $Al_{x2}Ga_{(1-x2)}As$ layer ($0 \leq x2 \leq 1$), each of the quantum well layers being formed of a $GaAs_{(1-x3)}P_{x3}$ layer ($0 \leq x3 \leq 1$).

12. The method of claim 11, wherein the $(Al_{x1}Ga_{(1-x1)})_{0.51}In_{0.49}P$ layer has a composition where $x1 > 0.7$, and the $Al_{x2}Ga_{(1-x2)}As$ layer has a composition where $0.4 \leq x2 \leq 0.8$.

13. The method of claim 11, further comprising, generating a tensile strain having a lattice mismatch rate of not greater than −0.4% and not less than −0.9% in each of the quantum well layers.

14. The method of claim 11, wherein the active layer has an oscillation wavelength of not less than 780 nm and not greater than 830 nm, and each of the quantum well layers has a thickness of not less than 9 nm and not greater than 12 nm.

15. The method of claim 11, wherein the $GaAs_{(1-x3)}P_{x3}$ layer has a composition satisfying a condition that a ratio x3/(1−x3) of a composition x3 of P to a composition (1−x3) of As is not less than 1/9 and not greater than 1/4.

16. The method of claim 11, wherein each of the quantum well layers has a thickness of not less than 9 nm and not greater than 12 nm, the barrier layer having a thickness smaller than the thickness of each of the quantum well layers.

17. The method of claim 11, wherein the number of the quantum well layers is not less than 2 and not greater than 5.

18. The method of claim 11, wherein the p-type clad layer and the n-type clad layer have a carrier concentration of not less than $0.7 \times 10^{18}$ cm$^{-3}$ and not greater than $2.0 \times 10^{18}$ cm$^{-3}$.

19. The method of claim 11, further comprising forming one or more end surface window structures for expanding a band gap of the active layer in one or more end surface portions of a laser resonator.

20. The method of claim 19, wherein the one or more end surface window structures are formed by selectively diffusing one or more impurities into the one or more end surface portions of the laser resonator, and a diffusion length of the impurities from an interface between the n-side guide layer and the n-type clad layer toward the n-type clad layer is not less than 400 nm and not greater than 1300 nm.

* * * * *